United States Patent
Okamoto et al.

(10) Patent No.: US 7,658,223 B2
(45) Date of Patent: Feb. 9, 2010

(54) BOILING AND COOLING DEVICE

(75) Inventors: Yoshiyuki Okamoto, Nagoya (JP); Hiroshi Tanaka, Toyoake (JP); Sho Ishii, Obu (JP)

(73) Assignee: Denso Corporation, Kariya (JP)

( * ) Notice: Subject to any disclaimer, the term of this patent is extended or adjusted under 35 U.S.C. 154(b) by 386 days.

(21) Appl. No.: 11/300,110

(22) Filed: Dec. 14, 2005

(65) Prior Publication Data

US 2006/0131001 A1 Jun. 22, 2006

(30) Foreign Application Priority Data

Dec. 22, 2004 (JP) .............................. 2004-371247

(51) Int. Cl.
*F28D 15/00* (2006.01)

(52) U.S. Cl. .............................. 165/104.33; 165/104.21; 29/890.032

(58) Field of Classification Search ............ 165/104.21, 165/104.26, 104.33, 185; 361/700, 704, 361/710, 719; 29/890.032, 890.043
See application file for complete search history.

(56) References Cited

U.S. PATENT DOCUMENTS

| | | | | |
|---|---|---|---|---|
| 4,073,427 A | * | 2/1978 | Keifert et al. | 228/165 |
| 4,461,343 A | * | 7/1984 | Token et al. | 29/890.032 |
| H260 H | * | 4/1987 | Morris et al. | 257/E23.193 |
| 5,103,290 A | * | 4/1992 | Temple et al. | 257/698 |
| 5,323,292 A | * | 6/1994 | Brzezinski | 165/185 |
| 5,632,158 A | * | 5/1997 | Tajima | 165/104.33 |
| 6,269,866 B1 | * | 8/2001 | Yamamoto et al. | 165/104.26 |
| 6,317,322 B1 | * | 11/2001 | Ueki et al. | 361/700 |
| 6,459,582 B1 | * | 10/2002 | Ali et al. | 361/704 |
| 6,483,708 B2 | * | 11/2002 | Ali et al. | 361/719 |
| 6,749,013 B2 | * | 6/2004 | Ikeda et al. | 165/104.26 |
| 6,871,701 B2 | * | 3/2005 | Ueki et al. | 165/104.26 |
| 6,900,984 B2 | * | 5/2005 | Merz et al. | 361/679.55 |
| 6,957,692 B1 | * | 10/2005 | Win-Haw et al. | 165/104.33 |
| 7,128,134 B2 | * | 10/2006 | Shih et al. | 165/104.26 |
| 7,204,299 B2 | * | 4/2007 | Bhatti et al. | 165/104.33 |
| 7,254,030 B2 | * | 8/2007 | Chiba et al. | 361/710 |
| 7,422,053 B2 | * | 9/2008 | Siu | 165/104.26 |
| 7,431,071 B2 | * | 10/2008 | Wenger | 165/104.26 |

FOREIGN PATENT DOCUMENTS

JP 2004-037074 2/2004

* cited by examiner

*Primary Examiner*—Ljiljana (Lil) V Ciric
(74) *Attorney, Agent, or Firm*—Harness, Dickey & Pierce, PLC

(57) ABSTRACT

A refrigerant tank includes a base plate made of cooper and a reinforcing frame made of stainless steel. A block made of copper extends through the reinforcing frame and has one face in contact with the base plate and an opposite face in contact with a heating body. Heat generated by the heating body is transferred through the cooper block and through the copper base plate to refrigerant inside the refrigerant tank. The stainless steel reinforcing frame provides strength to the refrigerant tank to allow the heating body to be pressed against the heating tank.

6 Claims, 5 Drawing Sheets

BOILING AND COOLING DEVICE

BACKGROUND OF THE INVENTION

1. Field of the Invention

The present invention relates to a boiling and cooling device for cooling a heating body of a semiconductor element by the transfer of latent heat generated when a refrigerant is boiled and condensed.

2. Description of the Related Art

According to the boiling and cooling device disclosed in the official gazette of JP-A-2004-37074, a material and a method of manufacturing a container to compose a refrigerant tank are not described. However, when consideration is given to the heat conduction characteristics, it is assumed that the boiling and cooling device is formed out of copper by means of press forming, forging or cutting. A refrigerant tank and a radiating section are usually joined to each other by means of brazing.

On the other hand, in the case where a heat sink is applied to a heating body, in order to reduce the contact heat resistance, it is usually required that the heat sink is attached by being strongly pushed to the heating body. Therefore, mechanical strength (rigidity) is required, of the container of the refrigerant tank of a boiling and cooling device, so that the container cannot be deformed even when a pushing force is applied to the container and so that the heat sink can be pushed to the heat generating body by an appropriate force.

However, the following problems may be encountered. In general, when a copper material is heated at the time of brazing, it is softened and the rigidity is lowered. Accordingly, the container of the cooling tank is easily deformed when a force is applied to it, and it is impossible to push the heat sink to the heating body with an appropriate force.

SUMMARY OF THE INVENTION

It is an object of the present invention to provide a boiling and heating device, in which a refrigerant tank and a heating section are joined by being brazed to each other, characterized in that: while making the most of the good heat transfer characteristic of copper, a heat sink can be pushed to the heating body with an appropriate force.

In order to accomplish the above object, according to a first aspect of the present invention, there is provided a boiling and cooling device comprising: a refrigerant tank (1) for storing a liquid-phase refrigerant, on the outer surface of which a heating body (90) is attached; and a radiating section (2) for cooling and condensing the refrigerant, which is boiled by heat of the heating body (90), and for returning the condensed refrigerant to the refrigerant tank (1), wherein the refrigerant tank (1) and the radiating section (2) are joined to each other by means of brazing, a container composing the refrigerant tank (1) including: a block (13) made of copper, one face of which is exposed inside the refrigerant tank (1), the other face of which is contacted with the heating body (90); and a lamination plate (12) composed of three layer structural material in which a reinforcing material (122) is interposed between skins (121) made of copper, the lamination plate (12) being joined to the block (13), wherein the reinforcing material (122) is made of material, the rigidity of which, after the completion of the brazing process, is higher than the rigidity of copper.

Due to the foregoing, the rigidity of the container composing the refrigerant tank can be ensured by a reinforcing member after the completion of the brazing process. Therefore, when the refrigerant container is pushed to the heating body, deformation of the refrigerant tank container can be suppressed. Further, heat can be transferred between the refrigerant and the heating body via a block made of copper, the heat transfer characteristic of which is good. Therefore, while making the most of the good heat transfer characteristic of copper, the refrigerant tank container can be pushed to the heat generating body by an appropriate force.

In this connection, as in a third aspect of the present invention, steel can be employed as the reinforcing material (122).

In this connection, the terminology "copper" used in this specification includes any of a pure copper and a copper alloy.

According to a boiling and cooling device of a second aspect of the present invention, the lamination plate (12) includes an opening portion (123) for communicating the inside with the outside of the refrigerant tank (1), and the block (13) is arranged in the opening portion (123).

Due to the foregoing, it is possible to easily realize such a structure that one face of the block is exposed to the inside of the refrigerant tank and the other face is contacted with the heat generating body.

According to a fourth aspect of the present invention, a boiling and cooling device comprises: a refrigerant tank (1) for storing a liquid-phase refrigerant, on the outer surface of which a heating body (90) is attached; and a radiating section (2) for cooling and condensing the refrigerant, which is boiled by heat of the heating body (90), and for returning the condensed refrigerant to the refrigerant tank (1), wherein the refrigerant tank (1) and the radiating section (2) are joined to each other by means of brazing, a container composing the refrigerant tank (1) including: a base plate made of copper, one face of which is exposed inside the refrigerant tank (1); a block (18) made of copper, one face of which is contacted with the base plate (16), the other face of which is contacted with the heating body (90); and a frame (17) for reinforcement arranged in a portion of the base plate (16) with which the block (18) is not contacted, wherein the frame (17) is made of material, the rigidity of which, after the completion of the brazing process, is higher than the rigidity of copper.

Due to the foregoing, the rigidity of the container composing the refrigerant tank can be maintained by the frame after the completion of brazing. Therefore, when the refrigerant container is pushed to the heating body, deformation of the refrigerant tank container can be suppressed. Further, heat can be transferred between the refrigerant and the heating body via the base plate and the block made of copper, the heat transfer characteristic of which is good. Therefore, while making the most of the high heat transfer characteristic of copper, the refrigerant tank container can be pushed to the heat generating body by an appropriate force.

In this connection, as in an eighth aspect of the present invention, steel can be employed as the frame (17).

According to a boiling and cooling device of a fifth aspect of the present invention, the frame (17) is located on the outer surface side of the base plate (16) and provided with an opening portion (171) for communicating the outer surface of the base plate (16) with the outside of the refrigerant tank (1), and the block (18) is arranged in the opening portion (171).

In this connection, in the case where the lamination plate has an opening portion for communicating the inside of the refrigerant tank with the outside like the second aspect of the present invention, the refrigerant may leak out from the joining portion in which the lamination plate is joined to the block. However, the opening portion of the frame in the fifth aspect of the present invention does not communicate the inside of the refrigerant tank with the outside. Accordingly, there is no possibility that the refrigerant will leak out from the opening portion.

According to a sixth aspect of the present invention, a boiling and cooling device comprises: a refrigerant tank (1) for storing a liquid-phase refrigerant, on the outer surface of which a heating body (90) is attached; and a radiating section (2) for cooling and condensing the refrigerant, which is boiled by heat of the heating body (90), and for returning the condensed refrigerant to the refrigerant tank (1), wherein the refrigerant tank (1) and the radiating section (2) are joined to each other by means of brazing, a container composing the refrigerant tank (1) including: a base plate (16) made of copper, one face of which is exposed inside the refrigerant tank (1), the other face of which is contacted with the heating body (90); and a frame (17) for reinforcement arranged in a portion of the base plate (16) with which the heating body (90) is not contacted, wherein the frame (17) is made of material, the rigidity of which, after the completion of the brazing process, is higher than the rigidity of copper.

Due to the foregoing, the rigidity of the container composing the refrigerant tank can be maintained by the frame after the completion of brazing. Therefore, when the refrigerant container is pushed to the heating body, deformation of the refrigerant tank container can be suppressed. Further, heat can be transferred between the refrigerant and the heating body via the base plate made of copper, the heat transfer characteristic of which is good. Therefore, while making the most of the good heat transfer characteristic of copper, the refrigerant tank container can be pushed to the heat generating body by an appropriate force.

In this connection, as in an eighth aspect of the present invention, steel can be employed as the frame (17).

According to a boiling and cooling device of a seventh aspect of the present invention, the frame (17) is located on the outer surface side of the base plate (16) and provided with an opening portion (171) for communicating the outer surface of the base plate (16) with the outside of the refrigerant tank (1), and a portion of the base plate (16) with which the heating body (90) is contacted is protruded from the opening portion (171) to the outside of the refrigerant tank (1).

In this connection, in the case where the lamination plate has an opening portion for communicating the inside of the refrigerant tank with the outside as in the second aspect of the present invention, the refrigerant may leak out from the joining portion in which the lamination plate is joined to the block. However, the opening portion of the frame in the seventh aspect of the present invention does not communicate the inside of the refrigerant tank with the outside. Accordingly, there is no possibility that the refrigerant will leak out from the opening portion.

As nothing corresponding to the block provided in the fourth aspect of the present invention is needed, the structure can be made simple and the low manufacturing cost can be realized. Further, there is no heat resistance at the contact face of the block with the base plate. Therefore, the heat transfer characteristic can be enhanced.

A portion on the base plate, with which the heat generating body is contacted, is protruded. Therefore, the base plate and the heat generating body can easily contact with each other.

Incidentally, the reference numerals in parentheses, to denote the above means, are intended to show the relationship of the specific means which will be described later in an embodiment of the invention.

The present invention may be more fully understood from the description of preferred embodiments of the invention set forth below, together with the accompanying drawings.

DESCRIPTION OF THE PREFERRED EMBODIMENTS

Figure 1:
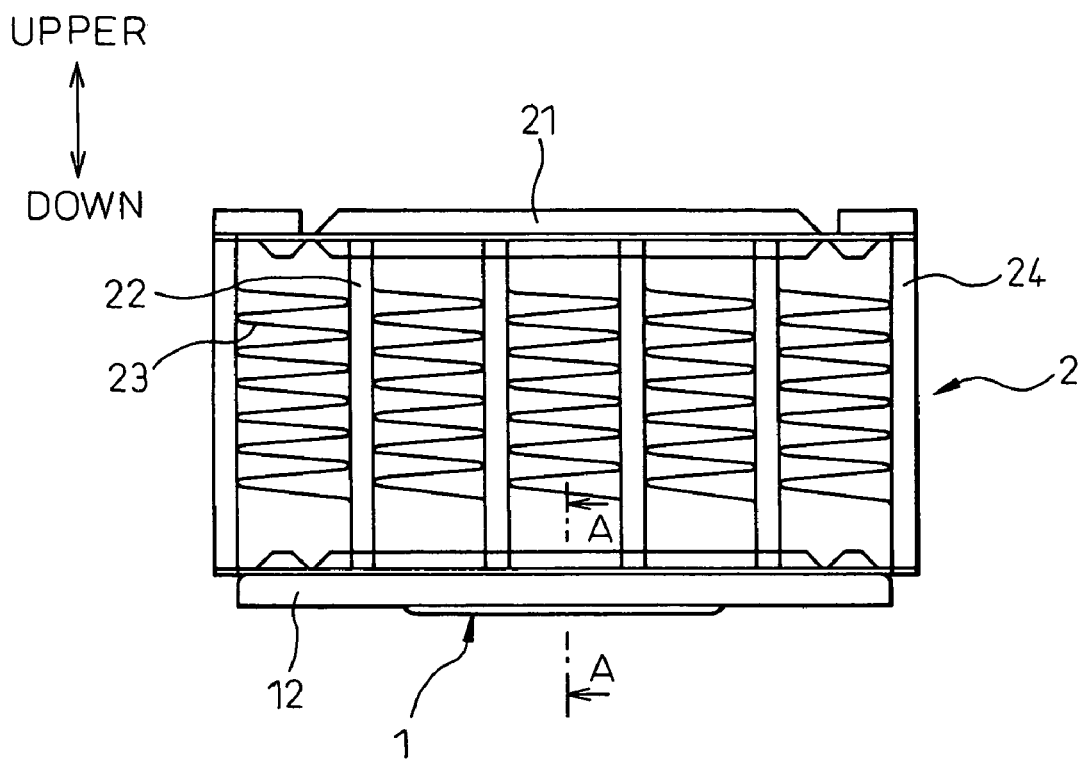
FIG. 1 is a front view showing a boiling and cooling device of the first embodiment of the present invention.
Figure 2:
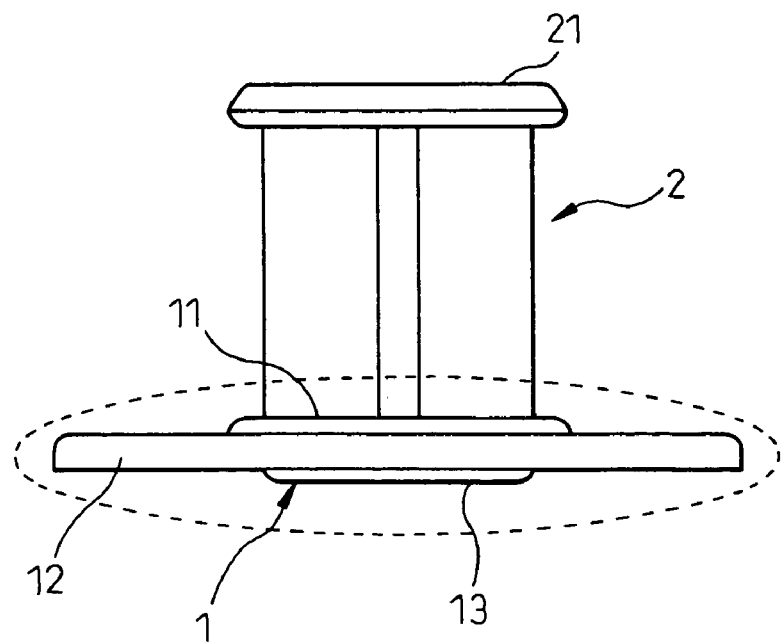
FIG. 2 is a right side view of FIG. 1.
Figure 3:
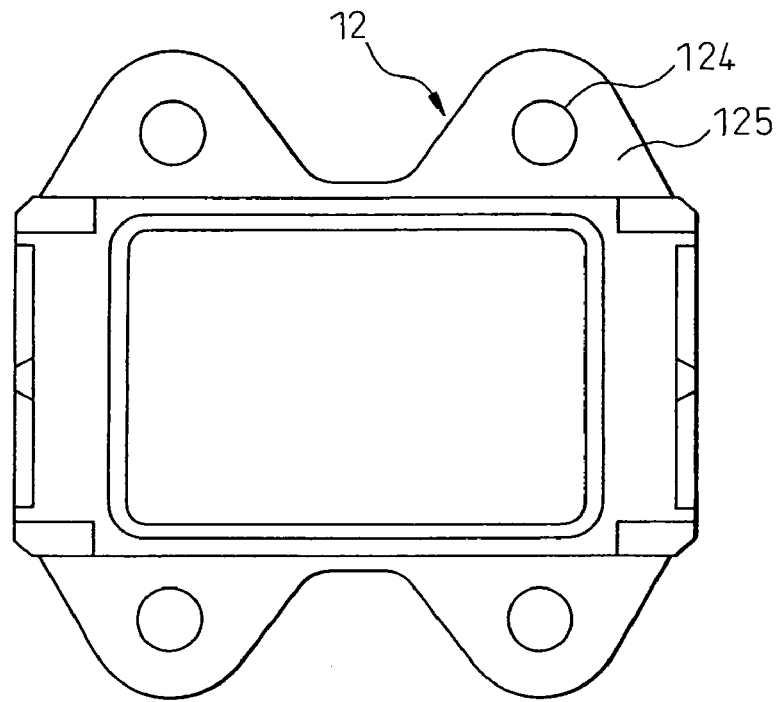
FIG. 3 is a plan view of FIG. 1.
Figure 4:
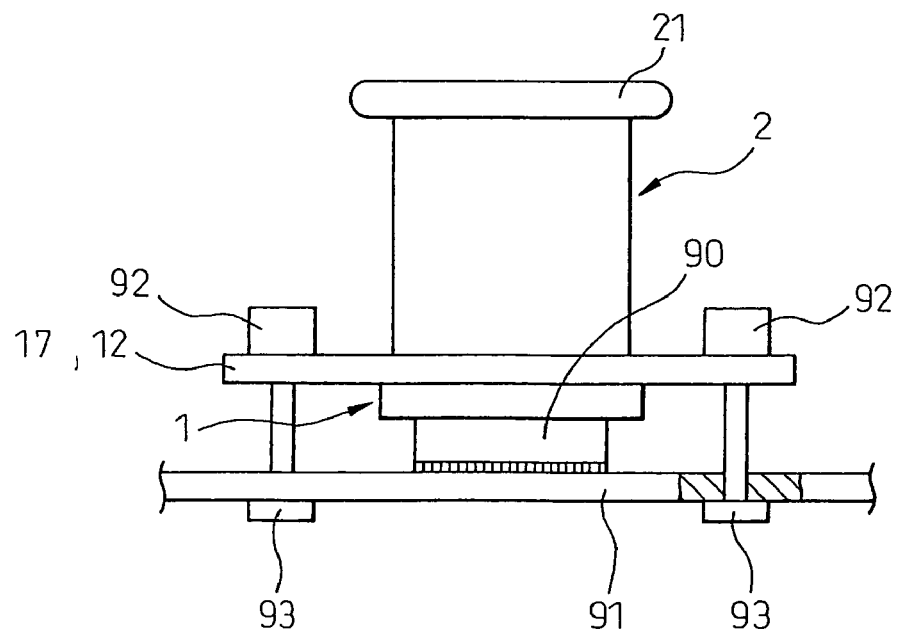
FIG. 4 is a side view showing a state in which a heating body is attached to the boiling and cooling device of the first embodiment of the present invention.

First of all, the first embodiment of the present invention will be explained below. FIG. 1 is a front view showing a boiling and cooling device of the first embodiment of the present invention, FIG. 2 is a right side view of FIG. 1, FIG. 3 is a plan view of FIG. 1, FIG. 4 is a side view showing a state in which a heating body is attached to the boiling and cooling device of the first embodiment of the present invention, FIG. 5 is a sectional view taken on line A-A in FIG. 1, and FIG. 6 is an exploded perspective view showing a primary portion of the boiling and cooling device shown in FIG. 1.

The boiling and cooling device shown in FIGS. 1 to 4 is used for cooling the heat generating body 90 of a semiconductor element. The boiling and cooling device includes: a refrigerant tank 1 for storing a liquid phase refrigerant inside, on to the outer surface of which the heating body 90 is attached; and a radiating section 2 which cools and condenses the refrigerant boiling with the heat generated by the heating body 90 and then returns the condensed refrigerant to the refrigerant tank 1.

The refrigerant tank 1 is a flat-box-shaped container, which is formed when the cover plate 11 made of copper and the lamination plate 12 are joined to each other so that a space for storing liquid phase refrigerant can be formed inside.

Figure 5:
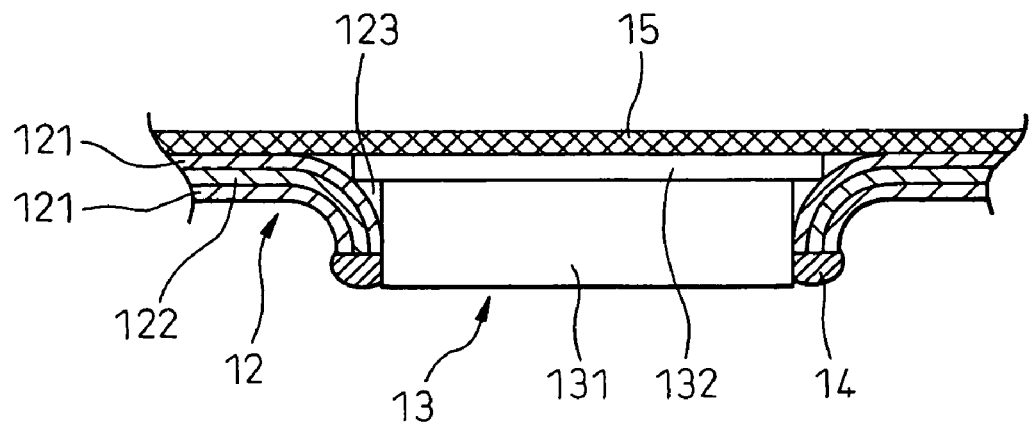
FIG. 5 is a sectional view taken on line A A in FIG. 1.
Figure 6:
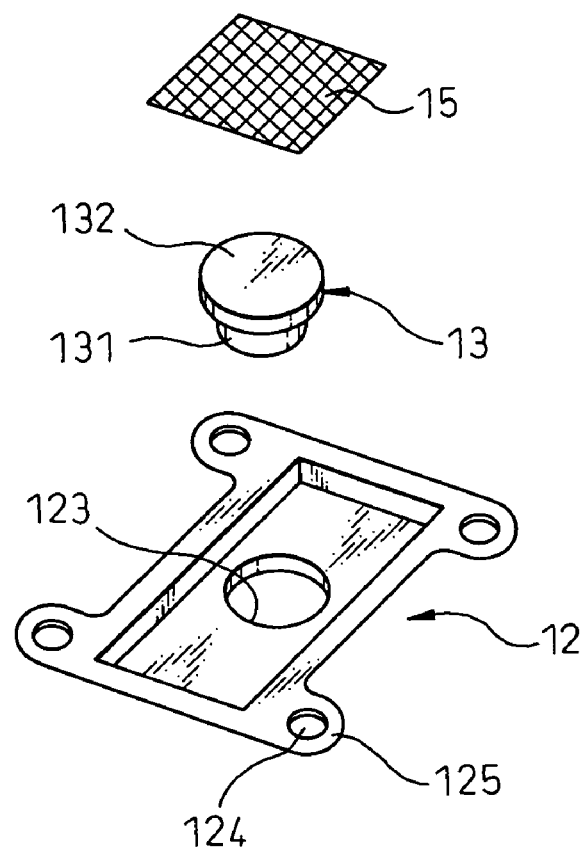
FIG. 6 is an exploded perspective view showing a primary portion of the boiling and cooling device shown in FIG. 1.

As shown in FIGS. 5 and 6, the lamination plate 12 is composed of a three layer structural member in which the reinforcing member 12 is interposed between pieces of the skin 121 made of copper. The lamination plate 12 includes a circular opening portion 123, which communicates the inside of the refrigerant tank 1 with the outside, into which the block 13 described later is inserted. The lamination plate 12 also includes four flange portions 125 having a hole 124 into which the bolt 92 described later is inserted.

The reinforcing member 122 is made of material, the rigidity of which, after the completion of the brazing process, is higher than that of copper. In this embodiment, the reinforcing member 122 is made of stainless steel. In this connection, even after diffusion joining of copper is conducted on stainless steel at about 1100° C. and even after brazing is conducted at 600 to 800° C., stainless steel is not softened and can maintain a high mechanical strength (rigidity).

The block 13 includes: a first columnar portion 131 made of copper and formed into a columnar shape; and a second columnar portion 132, the diameter of which is larger than that of the first columnar portion 131. Concerning the block 13, the first columnar portion 131 is press-fitted into the opening portion 123 of the lamination plate 12 until the second columnar portion 132 comes into contact with the skin 121 of the lamination plate 12 while the second columnar portion 132 is positioned inside the refrigerant tank 1. Due to the foregoing, an end face of the first columnar portion 131 is exposed outside the refrigerant tank 1, so that the refrigerant body 90 can be contacted with an end face of the first columnar portion 131.

At the time of brazing the entire boiling and cooling device so as to integrate it into one body, the press-fitting portion, in which the first columnar portion 131 is press-fitted into the opening portion 123, is tightly sealed with the ring-shaped brazing material 14 made of a phosphor copper or a silver brazing metal arranged outside the engaging portion in which the block 13 and the lamination plate 12 are engaged with each other.

The wick 15 is provided in the refrigerant tank 1. Before the entire boiling and cooling device is integrally brazed, the wick 15 is previously joined to the block 13 by diffusion. As well known, the wick 15 is porous. In this embodiment, the wick 15 is made of foamed copper.

As shown in FIGS. 1 to 4, the radiating portion 2 includes: a flat-box-shaped header 21 which is formed by joining two plates so that a space can be formed inside; a plurality of tubes 22 which communicate the header 21 with the refrigerant tank 1 so as to circulate the refrigerant between the header 21 and the refrigerant tank 1; fins 23 interposed between the tubes 22 so as to extend the radiation area; and a side plate 24 for connecting the header 21 with the refrigerant tank 1. In this connection, all the header 21, the tubes 22, the fins 23 and the side plate 24 are made of copper.

In the boiling and cooling device described above, after the wick 15 has been previously joined to the block 13 by diffusion, the components are integrally brazed to each other by the brazing metal provided between the components to be joined.

A predetermined amount of refrigerant is charged into the inner space of the boiling and cooling device which had been evacuated. Therefore, the inner space of the boiling and cooling device is maintained in a saturation state. In this case, water is used for the refrigerant. In this connection, not only water but also alcohol, fluorocarbon and chlorofluorocarbons may be used for the refrigerant.

The heating body 90 is mounted on the printed board 91. When the printed board 91 and the boiling and cooling device are joined to each other by the bolts 92 and the nuts 93, the block 13 is pushed to the heating body 90.

Next, operation of the boiling and cooling device composed as described above will be explained below.

Heat generated by the heating body 90 is transferred to the wick 15 via the block 13, and the liquid phase refrigerant in the wick 15 is boiled and vaporized by the heat. The thus vaporized gas-phase refrigerant rises in the tubes 22 and flows to the header 21. Heat is exchanged between the gas-phase refrigerant and the outside air when the gas-phase refrigerant flows in the tubes 22, so that the gas-phase refrigerant can be cooled. The thus cooled and condensed refrigerant descends in the tubes 22 and returns into the refrigerant tank 1.

As described above, the heat generated by the heating body 90 is transferred to the refrigerant and carried to the radiating portion 2. When the gas-phase refrigerant is condensed in this radiating portion 2, the heat is discharged as the latent heat of condensation. This latent heat of condensation is radiated to the outside air via the fins 23, so that the heating body 90 can be cooled.

In this embodiment, the rigidity of the container, which composes the refrigerant tank 1 can be maintained by the reinforcing member 122 after the completion of the brazing process. Therefore, deformation of the refrigerant container can be suppressed at the time of pushing the refrigerant container to the heating body 90. Further, heat can be transferred between the refrigerant and the heating body 90 via the block 13 made of copper, the heat transfer property of which is good. Therefore, while making the most of the good heat transfer property of copper, the refrigerant tank container can be pushed to the heating body 90 with an appropriate force.

As the skin 121 of the lamination plate 12 is made of copper, it is possible to suppress the generation of non-condensation gas by corrosion, and further it is possible to easily join the block 13 made of copper to the lamination plate 12 by means of brazing in which a common brazing metal such as a phosphor copper or a silver copper is used.

When the block 13 is formed into a columnar shape having a step portion and the second columnar portion 132, the diameter of which is large, is contacted with the skin 121 of the lamination plate 12, it is possible to prevent the brazing metal 14 from being sucked into the wick 15 in the case where brazing is conducted on the outside of the engaging portion of the block 13 and the lamination plate 12 with the ring-shaped brazing metal 14.

Figure 7:
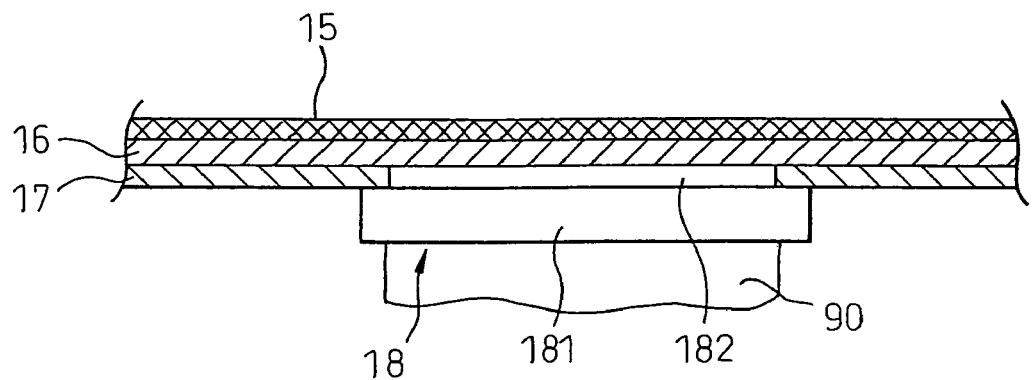
FIG. 7 is a sectional view showing a primary portion of the boiling and cooling device of the second embodiment of the present invention.
Figure 8:
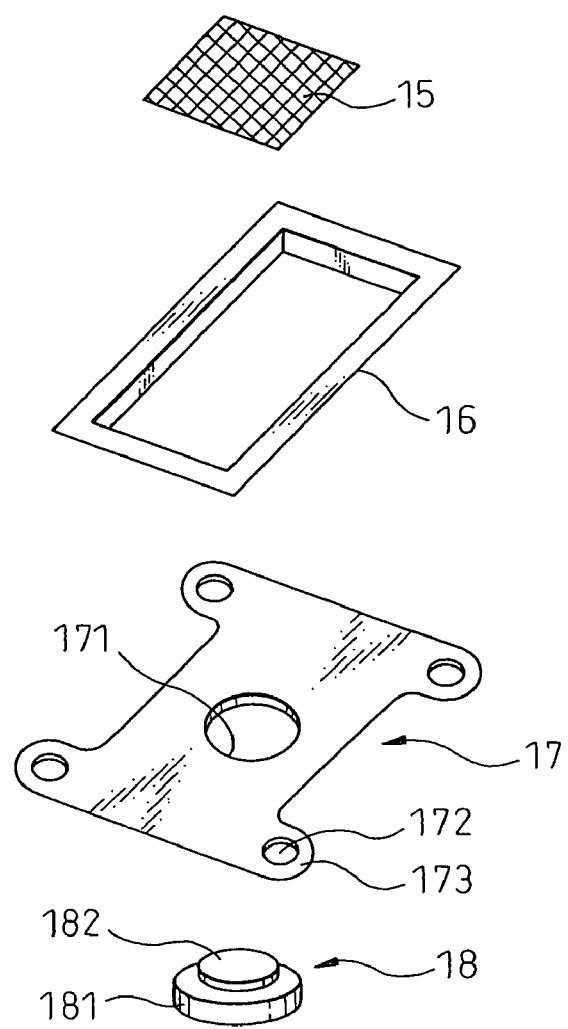
FIG. 8 is an exploded perspective view showing a primary portion of the boiling and cooling device of the second embodiment of the present invention.

Next, the second embodiment of the present invention will be explained below. FIG. 7 is a sectional view showing a primary portion of the boiling and cooling device of the second embodiment of the present invention, and FIG. 8 is an exploded perspective view showing a primary portion of the boiling and cooling device of the second embodiment of the present invention. The constitution of a container composing the refrigerant tank 1 in the present embodiment is different from that of the first embodiment. Note that when describing the second embodiment, the same reference numerals denote constituent members which are the same as or similar to those described with reference to the first embodiment, and an explanation is not given.

As shown in FIGS. 7 and 8, the refrigerant tank 1 is formed into a flat-box-shaped container, in which a space for storing the liquid-phase refrigerant is formed, when the cover plate 11 (shown in FIG. 1) made of copper and the base plate 16 made of copper are joined to each other. The reinforcing frame 17 is arranged outside the base plate 16.

The frame 17 includes: a circular opening portion 171 into which the block 18 described later is inserted; and four flange portions 173 having a hole 172 into which a bolt is inserted as illustrated in FIG. 8. The frame 17 is made of material, the rigidity of which, after the brazing process, is higher than that of copper. In this embodiment, the frame 17 is made of stainless steel.

The block 18 is made of copper. The block 18 includes: a first columnar portion 181 formed into a columnar shape: and a second columnar portion 182 formed into a columnar shape, the diameter of which is smaller than that of the first columnar portion 181. The second columnar portion 182 of the block 18 is inserted into the opening portion 171 of the frame 17 and an end face of the second columnar portion 182 is contacted with the base plate 16.

The frame 17 is interposed between the first columnar portion 181 of the block 18 and the base plate 16. An end face of the first columnar portion 181 is exposed outside the refrigerant tank 1, and the heating body 90 (shown in FIG. 1) is contacted with the end face of the first columnar portion 181. Due to this structure, heat generated by the heating body 90 is transferred to the wick 15 via the base plate 16 and the block 18.

In this connection, the base plate 16, the frame 17 and the block 18 are simultaneously brazed to each other when the entire boiling and cooling device is integrally brazed into one body.

In this embodiment, the rigidity of the container composing the refrigerant tank 1 after the completion of brazing is maintained by the frame 17. Therefore, deformation of the refrigerant tank container can be suppressed at the time of pushing the refrigerant tank container to the heating body 90. Further, heat can be transferred between the refrigerant and the heating body 90 via the base plate 16 and the block 18 which are made of copper, the heat transfer characteristic of which is good. Therefore, while making the most of the good heat transfer characteristic of copper, the refrigerant tank container can be pushed to the heating body 90 by applying an appropriate force.

As the base plate 16 is made of copper, it is possible to suppress the generation of non-condensation gas by corrosion, and further it is possible to easily join the block 18 made of copper to the base plate 16 by means of brazing in which a common brazing metal is used.

As the opening portion 171 of the frame 17 does not communicate the inside with the outside of the refrigerant tank 1, there is no possibility that the refrigerant leaks out from the opening portion 171 and that the brazing metal for joining the base plate 16 to the block 18 is sucked into the wick 15.

Figure 9:
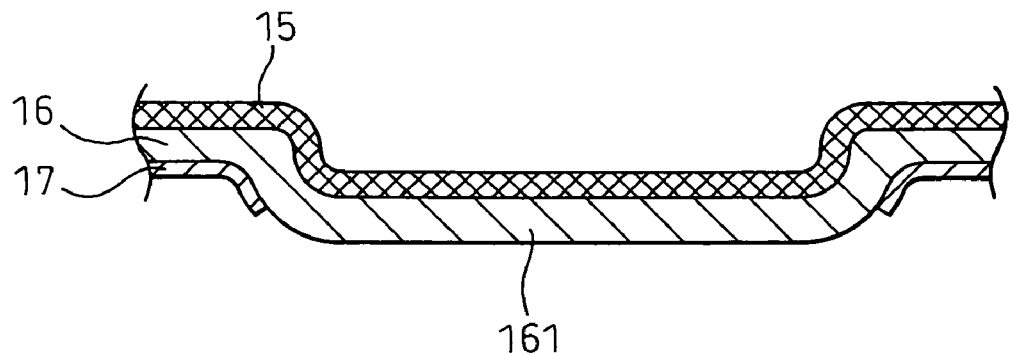
FIG. 9 is a sectional view showing a primary portion of the boiling and cooling device of the third embodiment of the present invention.
Figure 10:
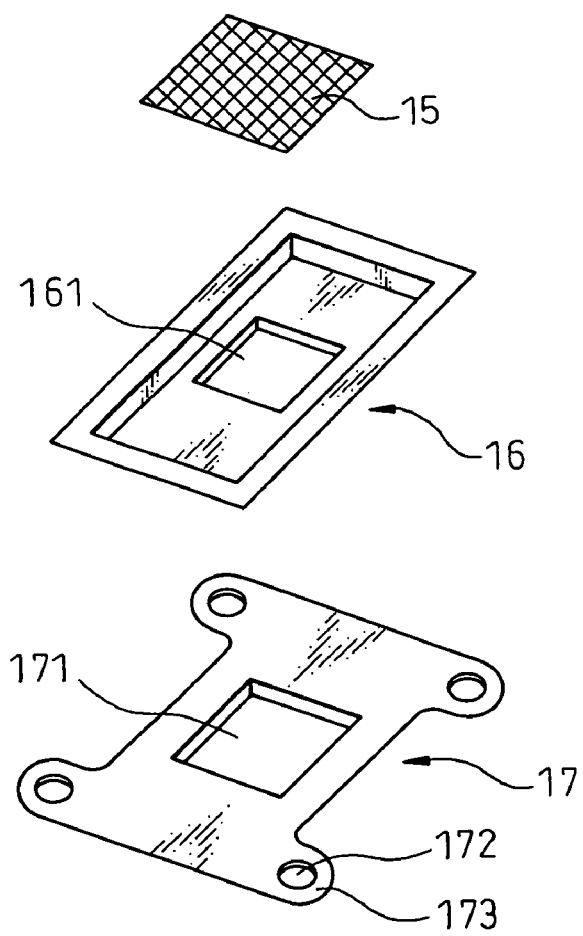
FIG. 10 is an exploded perspective view showing a primary portion of the boiling and cooling device of the third embodiment of the present invention.

Next, the third embodiment of the present invention will be explained below. FIG. 9 is a sectional view showing a primary portion of the boiling and cooling device of the third embodiment, and FIG. 10 is an exploded perspective view showing the primary portion of the boiling and cooling device of the third embodiment. This embodiment is composed in such a manner that the shape of the base plate 16 of the second embodiment is changed so that the block 18 can be eliminated. In this connection, like reference characters are used to indicate like parts in the second and the third embodiment and the explanations are omitted here.

As shown in FIGS. 9 and 10, a portion of the base plate 16 is embossed outwardly so as to form a protruding portion 161. This protruding portion 161 is inserted into the opening portion 171 of the frame 17 and protruded outside exceeding the opening portion 171, and an outer surface of this protruding portion 161 is contacted with the heating body 90 (shown in FIG. 1). Due to this structure, heat generated by the heating body 90 is transferred to the wick 15 via the base plate 16.

In this connection, the base plate 16 and the block 18 are simultaneously brazed to each other when the entire boiling and cooling device is integrally brazed into one body.

In this embodiment, the rigidity of the container composing the refrigerant tank 1 after the completion of brazing is maintained by the frame 17. Therefore, deformation of the refrigerant tank container can be suppressed at the time of pushing the refrigerant tank container to the heating body 90. Further, heat can be transferred from the refrigerant to the heating body 90 via the base plate 16 which is made of copper, the heat transfer characteristic of which is good. Therefore, while making the most of the good heat transfer characteristic of copper, the refrigerant tank container can be pushed to the heating body 90 by applying an appropriate force.

As the base plate 16 is made of copper, it is possible to suppress the generation of non-condensation gas by corrosion.

As the opening portion 171 of the frame 17 does not communicate the inside with the outside of the refrigerant tank 1, there is no possibility that the refrigerant will leak out from the opening portion 171.

In this embodiment, it is unnecessary to provide the block 18 which is needed in the second embodiment. Therefore, the structure can be made simple and the manufacturing cost can be reduced. Further, as no heat resistance exists between the block 18 and the base plate 16, the heat transfer characteristic can be improved.

Finally, another embodiment will be explained below. In the embodiments described above, the reinforcing member 122 or the frame 17 is made of stainless steel. However, the reinforcing member 122 or the frame 17 may be made of the other iron material such as carbon steel.

In the second and the third embodiment, the base plate 16 and the frame 17 are integrated with each other into one body by means of brazing. However, the base plate 16 and the frame 17 may be integrated with each other by means of caulking.

While the invention has been described by reference to specific embodiments chosen for purposes of illustration, it should be apparent that numerous modifications could be made thereto, by those skilled in the art, without departing from the basic concept and scope of the invention.

The invention claimed is:

1. A boiling and cooling device comprising:
a refrigerant tank for storing a refrigerant,
a heating body attached to an outer surface of the refrigerant tank; and
a radiating section for cooling and condensing the refrigerant, which is boiled by heat from the heating body, and for returning the condensed refrigerant to the refrigerant tank, wherein
the refrigerant tank and the radiating section are joined to each other by a brazing process,
the refrigerant tank includes a base plate made of copper, one face of the base plate is exposed to an inside of the refrigerant tank; a block made of copper, one face of the block is in direct contact with the base plate, an opposite face of the block is in direct contact with the heating body; and a frame for reinforcement arranged on a portion of the base plate not in contact with the block, the frame being in direct contact with the block;
the frame is made of a material other than copper, the rigidity of the frame, after a completion of the brazing process, is higher than the rigidity of copper.

2. The boiling and cooling device according to claim 1, wherein the frame is located on an outer surface of the base plate and provided with an opening portion for communicating an outer surface of the base plate with an outside of the refrigerant tank, and the block is arranged in the opening portion.

3. The boiling and cooling device according to claim 2, wherein an inner wall surface of the opening portion provided in the frame and an outer wall surface of the block arranged in the opening portion are brazed to each other.

4. The boiling and cooling device according to claim 2, wherein the block comprises a first columnar shaped portion and a second columnar shaped portion, a diameter of the second columnar shaped portion is smaller than a diameter of the first columnar shaped portion, the second columnar shaped portion is arranged in the opening portion of the frame so that an end face of the second columnar shaped portion is in direct contact with the base plate and the frame is interposed between the first columnar shaped portion and the base plate.

5. The boiling and cooling device according to claim 1, wherein the frame is made of steel.

6. The boiling and cooling device according to claim 1, wherein the frame comprises a plurality of flange portions, each flange portion defining a hole into which a fastener is inserted for mounting the frame to a printed board, the heating body being mounted to the printed board.

* * * * *